(12) United States Patent
Chen et al.

(10) Patent No.: US 10,185,336 B2
(45) Date of Patent: Jan. 22, 2019

(54) RECEIVER AND METHOD FOR CONTROLLER RECEIVER

(71) Applicant: MStar Semiconductor, Inc., Hsinchu Hsien (TW)

(72) Inventors: Chun-Chia Chen, Hsinchu Hsien (TW); Jian-Feng Shiu, Hsinchu Hsien (TW); Chia-Chi Liu, Hsinchu Hsien (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 0 days.

(21) Appl. No.: 15/610,749

(22) Filed: Jun. 1, 2017

(65) Prior Publication Data

US 2018/0239378 A1  Aug. 23, 2018

(30) Foreign Application Priority Data

Feb. 21, 2017 (TW) .............................. 106105714 A

(51) Int. Cl.
  *G05F 1/46* (2006.01)
  *H03K 5/24* (2006.01)
  *H03K 19/003* (2006.01)

(52) U.S. Cl.
  CPC ................. *G05F 1/46* (2013.01); *H03K 5/24* (2013.01); *H03K 19/00384* (2013.01)

(58) Field of Classification Search
  CPC .................................... G05F 1/46; H03K 5/24
  USPC ...................... 327/540, 538, 333; 326/80, 81
  See application file for complete search history.

(56) References Cited

U.S. PATENT DOCUMENTS

| | | | |
|---|---|---|---|
| 2003/0107411 A1* | 6/2003 | Martin | H04L 25/493 327/100 |
| 2012/0229214 A1* | 9/2012 | Kasanyal | H03F 3/45192 330/253 |
| 2015/0028954 A1* | 1/2015 | Tyan | G11C 11/4076 330/257 |

\* cited by examiner

*Primary Examiner* — Thomas Skibinski
(74) *Attorney, Agent, or Firm* — Edell, Shapiro & Finnan, LLC

(57) ABSTRACT

A receiver includes a bias current source, a comparator and an output circuit. The bias current source is powered by a first voltage source, and generates a bias current according to a second voltage source. The first voltage source is higher than the second voltage source. The comparator, coupled to the bias current source, compares two input signals to generate a comparison signal according to the bias current. The output circuit is powered by the second voltage source, and generates an output signal according to the comparison signal. The output signal and the second voltage source belong to the same power domain.

14 Claims, 3 Drawing Sheets

US 10,185,336 B2

RECEIVER AND METHOD FOR CONTROLLER RECEIVER

This application claims the benefit of Taiwan application Serial No. 106105714, filed Feb. 21, 2017, the subject matter of which is incorporated herein by reference.

BACKGROUND OF THE INVENTION

Field of the Invention

The invention relates in general to a receiver, and more particularly to a memory receiver including two voltage sources from different power domains and an associated control method.

Description of the Related Art

In a conventional memory receiver, there is usually one comparator that serves as a 1-bit analog-to-digital converter (ADC). A bias voltage or bias current that the comparator uses is provided by an input/output voltage source. An output signal of the comparator belongs to a same power domain as an input/output voltage that the input/output voltage source provides, and is thus affected by the input/output voltage source. The voltage provided by the input/output voltage source, which belongs to a higher voltage power domain (e.g., 3.3V), is commonly suitable for analog circuits and is therefore also referred to as an analog supply voltage (AVDD). However, the output signal of the comparator is for the use of a backend core circuit, and the bias voltage or bias current that the core circuit uses to operate is provided by a core voltage source. The voltage provided by a core voltage source, which belongs to a lower voltage power domain (e.g., 1V), is generally suitable for digital circuits and is thus also referred to as a digital supply voltage (DVDD). In a receiver, an output circuit is needed to convert the output signal of the comparator from the power domain of the input/output voltage source to the power domain of the core voltage source, and the output circuit is similarly powered by the core voltage source. In the above receiver structure, because the input/output voltage and the core supply voltage are two unrelated power domains. Therefore, when changes in the input/output voltage source and the core voltage source are inconsistent, influences of different scales are brought upon the comparator and the output circuit. As a result, an unstable duty cycle of the output signal at an output stage is caused and an effective range of an eye diagram is reduced, and such issues are further aggravated when the memory receiver is applied for high-speed reading/writing operations.

SUMMARY OF THE INVENTION

The invention is directed to a receiver including a structure capable of tracking a digital supply voltage, such that an output common mode voltage of a comparator may stay consistent with a transient level of an output stage to solve issues of the prior art.

A receiver is disclosed according to an embodiment of the present invention. The receiver includes a bias current source, a comparator and an output circuit. The bias current source is powered by a first voltage source, and generates a bias current according to a second voltage source. The first voltage source is higher than the second voltage source. The comparator, coupled to the bias current source, compares two input signal to generate a comparison signal according to the bias current. The output circuit is powered by the second voltage source, and generates an output signal according to the comparison signal. The output signal and the second voltage source belong to a same power domain.

A method for controlling a receiver is disclosed according to another embodiment of the present invention. The method includes: providing a bias current source that is powered by a first power source, and generating a bias current according to a second voltage source, wherein the first voltage source is higher than the second voltage source; comparing two input signals to generate a comparison signal according to the bias current; and generating an output signal through power provided by the second voltage source. The output signal and the second voltage source belong to a same power domain.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
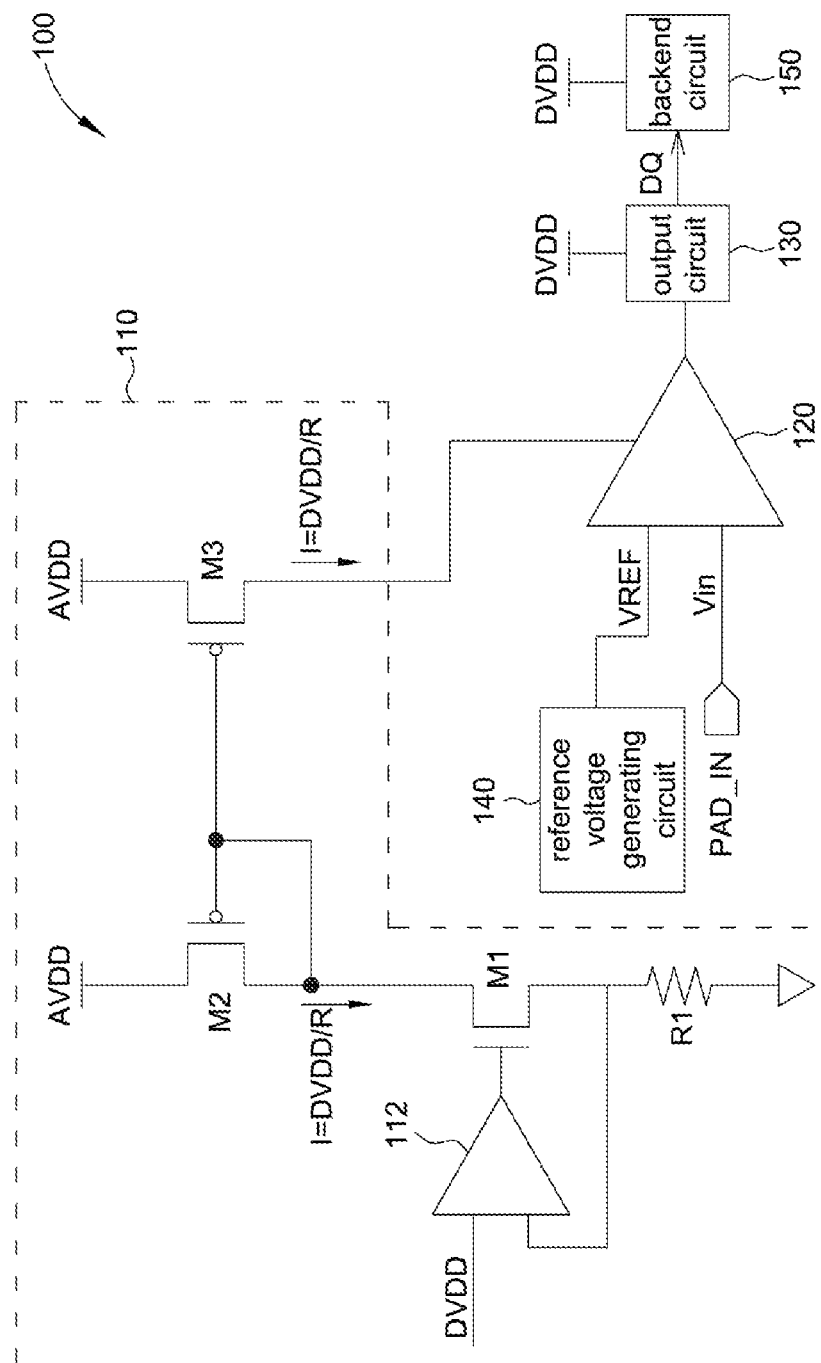
FIG. 1 is a block diagram of a receiver according to an embodiment of the present invention.

FIG. 1 shows a block diagram of a receiver 100 according to an embodiment of the present invention. As shown in FIG. 1, the receiver 100 includes a bias circuit 110, a comparator 120, an output circuit 130 and a reference voltage generating circuit 140. In this embodiment, the bias circuit 110 is a bias current source, and includes, for example but not limited to, an operational amplifier 112, a resistor R1 and three transistors M1, M2 and M3. In this embodiment, the receiver 100 is powered by two supply voltages from different power domains, e.g., an analog supply voltage AVDD and a digital supply voltage DVDD shown in the diagram. The level (e.g., 3.3V) of the analog supply voltage AVDD is higher than the level (e.g. 1V) of the digital supply voltage AVDD.

In an operation of the receiver 100, the bias circuit 110 is powered by the analog supply voltage AVDD, and generates a bias signal to the comparator 120 according to the digital supply voltage DVDD. More specifically, the operational amplifier 112 has an output end connected to the gate of the transistor M1, a first input end receive the digital supply voltage DVDD, and a second input end connected to the source of the transistor M1. Thus, a current I passing the transistor M1 is (DVDD/R), where "R" is a resistance value of the resistor R1. The transistors M2 and M3 serve as a current mirror, which duplicates the current passing the transistors M1 and M2 to generate a bias current, and uses the bias current as a bias signal that is then transmitted to the comparator 120. It should be noted that, although the bias circuit 110 is powered by the analog supply voltage AVDD, the bias signal (i.e., the current I in the diagram) it generates is associated with only the digital supply voltage DVDD and is free from effects of the voltage level of the analog supply voltage AVDD.

Next, the comparator 120 compares two input signals according to the bias signal that the bias circuit 110 generates to generate a comparison signal. One of the two input signals is a reference voltage VREF from the reference voltage generating circuit 140, and the other is an input signal Vin from a node PAD_IN (i.e., from an external circuit). In this embodiment, the reference voltage VREF may by one half of the digital supply voltage DVDD, i.e., VREF=(DVDD/2).

The output circuit 130 is powered by the digital supply voltage DVDD, and generates an output signal DQ for a backend circuit 150 according to the comparison signal that the comparator 120 outputs. The purpose of the output circuit 130 is to increase a thrust of the signal such that the signal may sufficiently serve the backend circuit 150. The comparison signal belongs to the power domain of the analog supply voltage AVDD, the output signal belongs to the power domain of the digital supply voltage DVDD, and the backend circuit 150 is powered by the digital supply voltage DVDD.

As described, the current value of the bias signal that the comparator 120 receives is determined by the digital supply voltage (i.e., I=DVDD/R) and is not associated with the analog supply voltage AVDD. Thus, when the analog supply voltage AVDD becomes unstable, the comparator 120 and the output circuit 130 are free from any effects of the analog supply voltage AVDD. Conversely, when the digital supply voltage DVDD becomes unstable, the comparator 120 and the output circuit 130 receive effects of the same scale. Therefore, the present invention is capable of keeping the output signal DQ of the output circuit stable, and maintaining preferred eye diagram limits in high-speed applications, i.e., maintaining an effective range of an eye diagram. In this embodiment, the level of the comparison signal that the comparator outputs 120 is between 0 and DVDD, and the output common mode voltage of the comparator 120 is (DVDD/2). In this embodiment, the reference voltage VREF is similarly one half of the digital supply voltage (DVDD/2). Thus, when the output common mode voltage of the comparator and the reference voltage VREF are consistent, it is ensured that the comparison signal outputted by the comparator 120 and the output signal DQ subsequently generated by the output circuit 130 have more stable duty cycles in high-speed applications, and a better effective range is maintained, i.e., better eye diagram limits are maintained.

Figure 2:
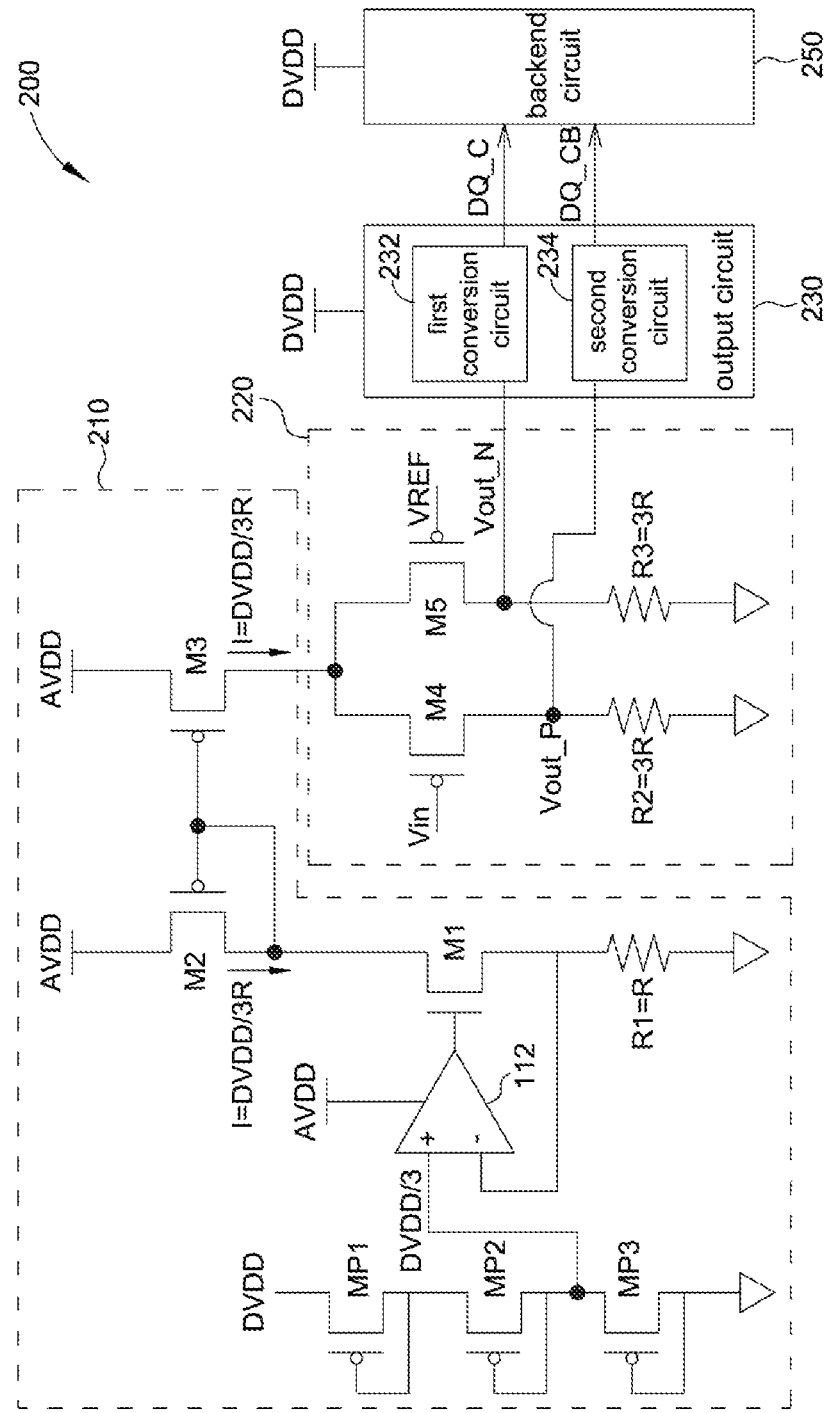
FIG. 2 is a block diagram of a receiver according to another embodiment of the present invention.

FIG. 2 shows a block diagram of a receiver according to an embodiment of the present invention. In FIG. 2, a receiver 200 includes a bias circuit 210, a comparator 220 and an output circuit 230. In this embodiment, the bias circuit 210 is a bias current source; the comparator includes two transistors M4 and M5 and two resistors R2 and R3, and generates a pair of differential signals Vout_N and Vout_P as comparison signals; and the output circuit 230 includes a first conversion circuit 232 and a second conversion circuit 234, which respectively receive the differential signals Vout_N and Vout_P to generate a pair of differential output signals DQ_C and DQ_CB. In the embodiment in FIG. 2, similar to the bias circuit 110, the bias circuit 210 includes an operational amplifier 112, a resistor R1 and three transistors M1, M2 and M3, and further includes an internal bias circuit consisted of the three transistors MP1, MP2 and MP3. The internal bias circuit divides the digital supply voltage DVDD to generate a signal (whose level is DVDD/3 in this embodiment). Further, in this embodiment, a first input end of the operational amplifier 112 receives the signal from the internal bias circuit, and so the current I passing the transistor M1 is (DVDD/3R). That is to say, the bias signal generated by the bias circuit 210 is (DVDD/3R). With resistance values of the resistors R2 and R3 in the comparator 220 set to (3*R), the levels of the differential signals Vout_N and Vout_P may similarly fall between 0 and DVDD. As opposed to the embodiment in FIG. 1, the embodiment in FIG. 2 is capable of reducing the overall power consumption because the current I in the bias circuit 210 is only ⅓ of that of the structure shown in FIG. 1.

Further, the first conversion circuit 232 and the second conversion circuit 234 included in the output circuit 230 are powered by the digital supply voltage DVDD, and generate the differential signals DQ_C and DQ_CB for the use of a backend circuit 250 according to the differential signals Vout_N and Vout_P that the comparator 120 outputs. The purpose of the output circuit 230 is to increase the thrust of the signal such that the signal may sufficiently serve the backend circuit 250. The differential signals Vout_N and Vout_P belong to the power domain of the analog supply voltage AVDD, the differential output signals DQ_C and DQ_CB belong to the power domain of the digital supply voltage DVDD, and the backend circuit 250 is powered by the digital supply voltage DVDD.

It should be noted that, the level of the signal generated by the bias circuit and the resistance values of the resistors R2 and R3 in FIG. 2 are only examples for illustrative purposes and are not to be construed as limitations to the present invention. In an alternative embodiment, the level of the signal generated by the bias circuit may be (DVDD/M), and the resistance values of the resistors R2 and R3 may be (M*R), where M may be any appropriate integer. These design modifications are to be encompassed within the scope of the present invention.

Figure 3:
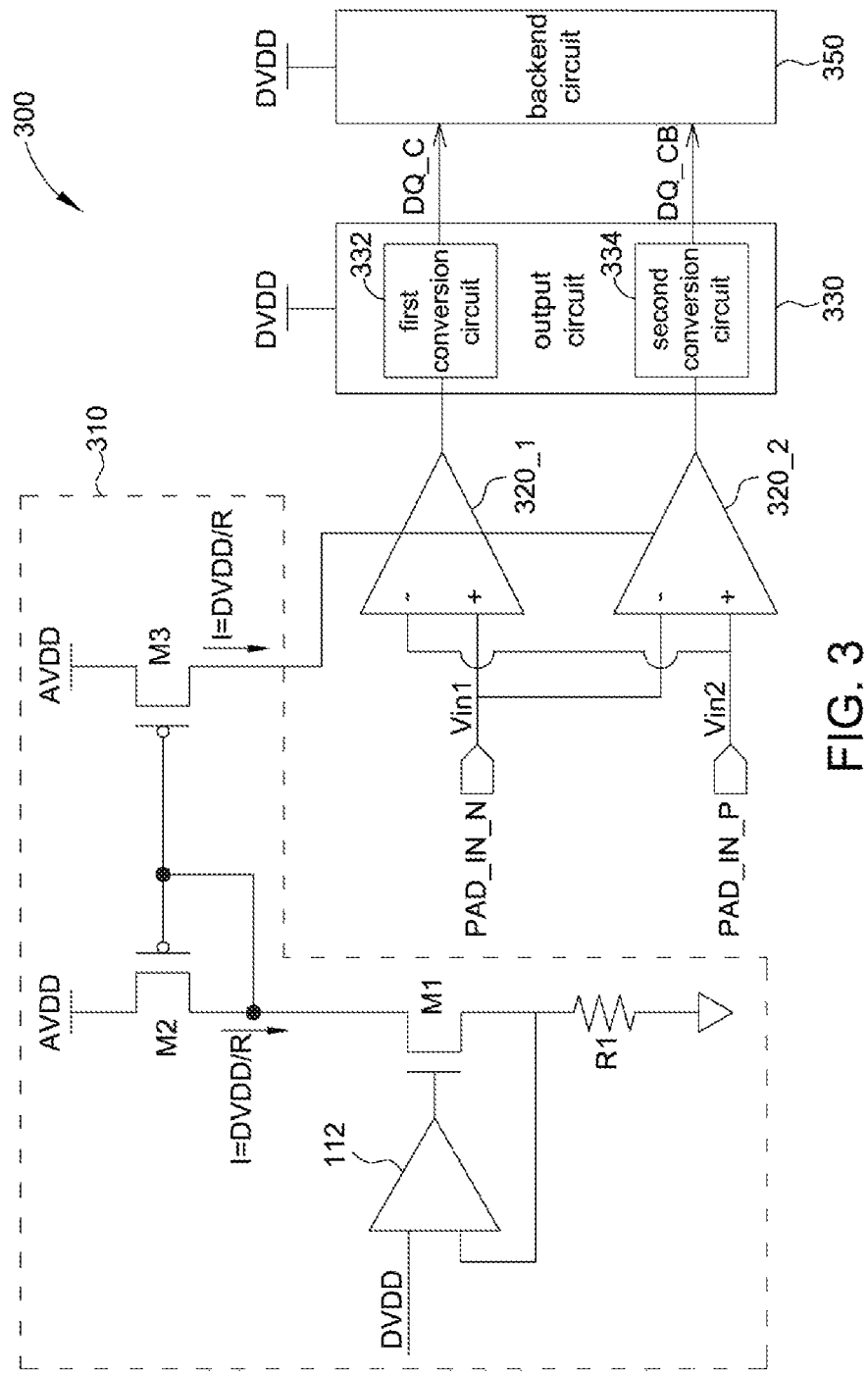
FIG. 3 is a block diagram of a receiver according to yet another embodiment of the present invention.

FIG. 3 shows a block diagram of a receiver 300 according to another embodiment of the present invention. As shown in FIG. 3, the receiver 300 includes a bias circuit 310, two comparators 320_1 and 320_2, and an output circuit 330. In this embodiment, the bias circuit 310 is a bias current source. In this embodiment, similar to the bias circuit 110, the bias circuit 310 includes an operational amplifier 112, a resistor R1 and three transistors M1, M2 and M3; and the output circuit 330 includes a first conversion circuit 332 and a second conversion circuit 334. In this embodiment, the receiver 300 is powered by two supply voltages that belong to different power domains, e.g., the analog supply voltage AVDD and the digital supply voltage DVDD in FIG. 3, with the level (e.g., 3.3V) of the analog supply voltage AVDD being higher than the level (e.g., 1V) of the digital supply voltage DVDD.

In an operation of the receiver 300, operation details of the bias circuit 310 are similar to that of the bias circuit 110 in FIG. 1, and shall be omitted herein. The comparator 320_1 compares two input signals according to a bias current signal that the bias circuit 310 generates to generate a first comparison signal. Positive and negative input ends of the comparator 320_1 respectively receive differential signals Vin1 and Vin2 from nodes PAD_IN_N and PAD_IN_P. The comparator 320_2 compares two input signals according to the bias current signal that the bias circuit 310 generates to generate a second comparison signal. Positive and negative input nodes of the comparator 320_2 respectively receive the differential signals Vin2 and Vin1 from the nodes PAD_IN_P and PAD_IN_N. The first conversion circuit 332 generates a first output signal DQ_C according to the first comparison signal that the comparator 320_1 outputs, the second conversion circuit 334 generates a second output signal DQ_CB according to the second comparison signal that the comparator 320_2 outputs, and the first and second comparison signals are to be used by the backend circuit 350.

The bias currents that the comparators 320_1 to 320_2 receive are directly associated with the digital supply voltage DVDD but not associated with the analog supply voltage AVDD. Therefore, it is ensured that the levels of the comparison signals outputted by the comparators 320_1 and 320_2 and the output signals DQ_C and DQ_CB outputted by the output circuit 330 are between 0 and DVDD. Further, the output signals DQ_C and DQ_CB generated by the output circuit 330 may have a more accurate duty cycle to maintain better eye diagram limits in high-speed applications.

In the embodiments in FIG. 1 to FIG. 3, the bias circuits 110, 210 and 310 generate the bias currents to the comparators 120, 220, 320_1 and 320_2 through a current mirror approach. However, the bias circuits 110, 210 and 310 may also directly transmit voltage signals to the comparators 120, 220, 320_1 and 320_2. In other words, given that the a ratio relationship exists between the bias signals generated by the bias circuits 110, 210 and 310 and the digital supply voltage DVDD but not the analog supply voltage AVDD, the bias signals may be voltage signals or current signals.

In a variation embodiment, the comparators 120, 220, 320_1 and 320_2 in the embodiments in FIGS. 1 to 3 may be single-stage comparators or multi-stage comparators.

In conclusion, in the receiver and associated method of the present invention, the bias signal that the comparator uses is associated with the digital supply voltage but not the analog supply voltage and is consistent with the output circuit. Therefore, it is ensured that the output signal generated by the output circuit has a more accurate duty cycle to maintain better eye diagram limits in high-speed applications.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A receiver, comprising:
    a bias current source, powered by a first voltage source, generating a bias current according to a second voltage source, wherein the first voltage source is higher than the second voltage source;
    a comparator, coupled to the bias current source, comparing two input signals to generate a comparison signal according to the bias current; and
    an output circuit, coupled to the comparator, powered by the second voltage source to generate an output signal according to the comparison signal, wherein the output signal and the second voltage source belong to a same power domain,
    wherein the two signals received by the comparator are respectively an input signal from an external circuit and a reference voltage, and
    wherein the comparison signal has a common mode voltage, and the reference voltage is equal to the common mode voltage.

2. The receiver according to claim 1, wherein a current value of the bias current is unaffected by the first voltage source.

3. The receiver according to claim 1, wherein the bias current source comprises:
    a transistor;
    a resistor, having a first node coupled to a source of the transistor and a second node coupled to a third voltage source;
    an operational amplifier, comprising a first input end, a second input end and an output end, wherein the first input end receives a signal associated with the second voltage source, the second input end is coupled to the first node of the resistor, and the output end is coupled to a gate of the transistor; and
    a current mirror, powered by the first voltage source, duplicating a current passing the transistor to generate the bias current.

4. The receiver according to claim 3, wherein the third voltage source is a ground voltage source.

5. The receiver according to claim 3, wherein the signal associated with the second voltage source is generated from voltage dividing the second voltage source.

6. The receiver according to claim 3, wherein the signal associated with the second voltage source has an associated voltage value, the resistor is a first resistor, and the comparator comprises:
    a first transistor, comprising a gate, a first electrode and a second electrode, the gate receiving one of the two input signal, and the first electrode receiving the bias current;
    a second transistor, comprising a gate, a first electrode and a second electrode, the gate receiving the other of the two input signals, and the first electrode receiving the bias current;
    a second resistor, coupled between the second electrode of the first transistor and the third voltage source; and
    a third resistor, coupled between the second electrode of the second transistor and the third voltage source;
    wherein, the resistor has a first resistance value, the second resistor and the third resistor have a second resistor value, a multiple relationship between the second resistance value and the first resistance value is equal to a multiple relationship between a voltage value of the second voltage source and the associated voltage value.

7. The receiver according to claim 1, wherein the first voltage source is a supply voltage of an analog circuit, and the second voltage source is a supply voltage of a digital circuit.

8. The receiver according to claim 1, wherein the two signals received by the comparator are a pair of differential signals.

9. The receiver according to claim 8, wherein the comparator is a first comparator, the comparison signal is a first comparison signal, and the output signal is a first output signal, the receiver further comprising:
    a second comparator, coupled to the bias circuit, comparing the two input signals to generate a second comparison signal according to the bias current; and
    a second output circuit, powered by the second voltage source to generate a second output signal according to the second comparison signal.

10. A method for controlling a receiver, comprising:
    generating a bias current according to a second voltage source by a bias current source powered by a first voltage source, wherein the first voltage source is higher than the second voltage source;
    comparing two input signals by a comparator to generate a comparison signal according to the bias current; and
    generating an output signal according to the comparison signal by an output circuit powered by the second voltage source, wherein the output signal and the second voltage source belong to a same power domain, wherein the two input signals are respectively an input signal from an external circuit and a reference voltage, and wherein the comparison signal has a common mode voltage, and the reference voltage is equal to the common mode voltage.

11. The method according to claim 10, wherein a current value of the bias current source is unaffected by the first voltage source.

12. The method according to claim 10, wherein the first voltage source is a supply voltage of an analog circuit, and the second voltage source is a supply voltage of a digital circuit.

13. The method according to claim 10, wherein the two input signals are a pair of differential signals.

14. The method according to claim 13, wherein the comparison signal is a first comparison signal, and the output signal is a first output signal, the method further comprising:

comparing the two input signals to generate a second comparison signal according to the bias current; and generating a second output signal according to the second comparison signal.

\* \* \* \* \*